United States Patent
Park et al.

(10) Patent No.: US 9,035,309 B2
(45) Date of Patent: May 19, 2015

(54) 3D CMOS IMAGE SENSORS, SENSOR SYSTEMS INCLUDING THE SAME

(75) Inventors: Young-soo Park, Yongin-si (KR);
 Won-joo Kim, Hwaseong-si (KR);
 Kyoo-chul Cho, Yongin-si (KR);
 Gi-jung Kim, Yongin-si (KR);
 Sam-jong Choi, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 1171 days.

(21) Appl. No.: 12/984,972

(22) Filed: Jan. 5, 2011

(65) Prior Publication Data

US 2011/0193940 A1 Aug. 11, 2011

(30) Foreign Application Priority Data

Feb. 5, 2010 (KR) .......................... 10-2010-0011183

(51) Int. Cl.
 *H01L 27/146* (2006.01)
(52) U.S. Cl.
 CPC .... *H01L 27/14629* (2013.01); *H01L 27/14687* (2013.01)
(58) Field of Classification Search
 CPC ............................................... H01L 27/14629
 See application file for complete search history.

(56) References Cited

U.S. PATENT DOCUMENTS

| 2005/0205930 | A1* | 9/2005 | Williams, Jr. .................. 257/347 |
| 2007/0194356 | A1* | 8/2007 | Moon et al. .................... 257/291 |
| 2008/0179640 | A1* | 7/2008 | Chuang et al. ................. 257/292 |

FOREIGN PATENT DOCUMENTS

| KR | 1020030082557 A | 10/2003 |
| KR | 1020060062461 A | 6/2006 |
| KR | 1020060077089 A | 7/2006 |
| KR | 1020080047659 A | 5/2008 |

* cited by examiner

*Primary Examiner* — Daniel Luke
(74) *Attorney, Agent, or Firm* — Myers Bigel Sibley & Sajovec, PA

(57) ABSTRACT

A three-dimensional (3D) CMOS image sensor (CIS) that sufficiently absorbs incident infrared-rays (IRs) and includes an infrared-ray (IR) receiving unit formed in a thin epitaxial film, thereby being easily manufactured using a conventional CIS process, a sensor system including the 3D CIS, and a method of manufacturing the 3D CIS, the 3D CIS including an IR receiving part absorbing IRs incident thereto by repetitive reflection to produce electron-hole pairs (EHPs); and an electrode part formed on the IR receiving part and collecting electrons produced by applying a predetermined voltage thereto.

18 Claims, 13 Drawing Sheets

3D CMOS IMAGE SENSORS, SENSOR SYSTEMS INCLUDING THE SAME

REFERENCE TO PRIORITY APPLICATION

This application claims priority to Korean Patent Application No. 10-2010-0011183, filed Feb. 5, 2010, the contents of which are hereby incorporated herein by reference.

FIELD OF THE INVENTION

The inventive concept relates to image sensors and, more particularly, to three-dimensional (3D) complementary metal-oxide-semiconductor (CMOS) image sensors.

BACKGROUND

In general, image sensors are semiconductor devices that convert an optical image to an electric signal. Image sensors are classified into charge-coupled devices (CCDs) and CMOS image sensors (CISs). A CCD is a device in which metal-oxide-silicon (MOS) capacitors are disposed very close to each other, and charge carriers are stored in and transferred through the MOS capacitors. In contrast, a CMOS image sensor is a device employing CMOS technology, which uses a control circuit and a signal processing circuit as peripheral circuits, such that a number of MOS transistors, each associated with a unit pixel, are formed on a semiconductor substrate, whereby outputs of the respective unit pixels are sequentially detected by the MOS transistors by a switching method.

In addition, thermal infrared-ray image sensors, which are another type of image sensors include a lens for concentrating thermal infrared-rays emitted from an object having a constant temperature, thermal infrared-ray sensing elements, and a readout chip for extracting signals obtained by the thermal infrared-ray sensing elements. The thermal infrared-ray sensing elements may be classified into a semiconductor-type thermal infrared-ray sensing element using semiconductors and a heat-type thermal infrared-ray sensing element using thermal effects.

The semiconductor-type thermal infrared-ray sensing element includes a material having a low band gap, and thus, when thermal infrared-rays are incident thereto, electrons and holes are excited by the thermal infrared-rays, whereby the semiconductor-type thermal infrared-ray sensing element has high sensitivity. In such a semiconductor type thermal infrared-ray sensing element, a readout chip for processing signals requires a high gain and complicated noise processing, and thus an infrared ray sensor including the semiconductor-type thermal infrared-ray sensing element is generally manufactured using a CMOS manufacturing process.

On the other hand, in the heat-type thermal infrared-ray sensing element, when thermal infrared rays focused on a lens are incident on a thermal infrared ray absorbing part, the thermal infrared ray absorbing part absorbs the thermal infrared rays, thereby increasing the temperature thereof to capture a thermal image. In the heat-type thermal infrared-ray sensing element, any one method selected from a method of using a phase transition material sensitive to temperature, a method of using characteristics of ferroelectrics according to temperature, and a method of using a thermal electromotive force when a temperature increases may be used.

SUMMARY

Complementary metal-oxide semiconductor (CMOS) image sensors according to embodiments of the invention include a substrate having a light receiving surface thereon and a first light reflecting film extending within the substrate. The first light reflecting film is configured to redirect light incident thereon towards the light receiving surface. A second light reflecting film is also provided on the light receiving surface. The second light reflecting film is configured to redirect reflected light received from the first light reflecting film towards the first light reflecting film. A distance between the first and second light reflecting films may be in a range between about 3 um and 4 um in some embodiments of the invention. A first electrode is also provided, which is electrically coupled to the substrate. The first electrode is configured to collect charge carriers generated in response to a reflection of light between the first and second light reflecting films. This first electrode may be responsive to a first periodic signal and the first light reflecting film may include a material selected from a group consisting of p-type silicon, germanium, silicon germanium, oxide and silicon nitride.

According to additional embodiments of the invention, a second electrode may be provided, which is electrically coupled to the substrate. The second electrode is configured to collect charge carriers generated in response to the reflection of light between the first and second light reflecting films. This second electrode may be responsive to a second periodic signal. According to some embodiments of the invention, the first and second periodic signals may be clock signals having different phases relative to each other.

According to still further embodiments of the invention, a method of forming a CMOS image sensor may include forming a trench in a semiconductor substrate and forming a first light reflecting film on a bottom of the trench. This first light reflecting film may be configured to redirect light incident thereon towards a light receiving surface of the CMOS image sensor. A semiconductor layer may be epitaxially grown onto an upper surface of the first light reflecting film to thereby fill the trench. Then, a second light reflecting film may be formed on the semiconductor layer. This second light reflecting film is configured to redirect reflected light received from the first light reflecting film towards the first light reflecting film. A first electrode is formed, which is electrically coupled to the semiconductor substrate. This first electrode is configured to collect charge carriers generated in response to a reflection of light between the first and second light reflecting films.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
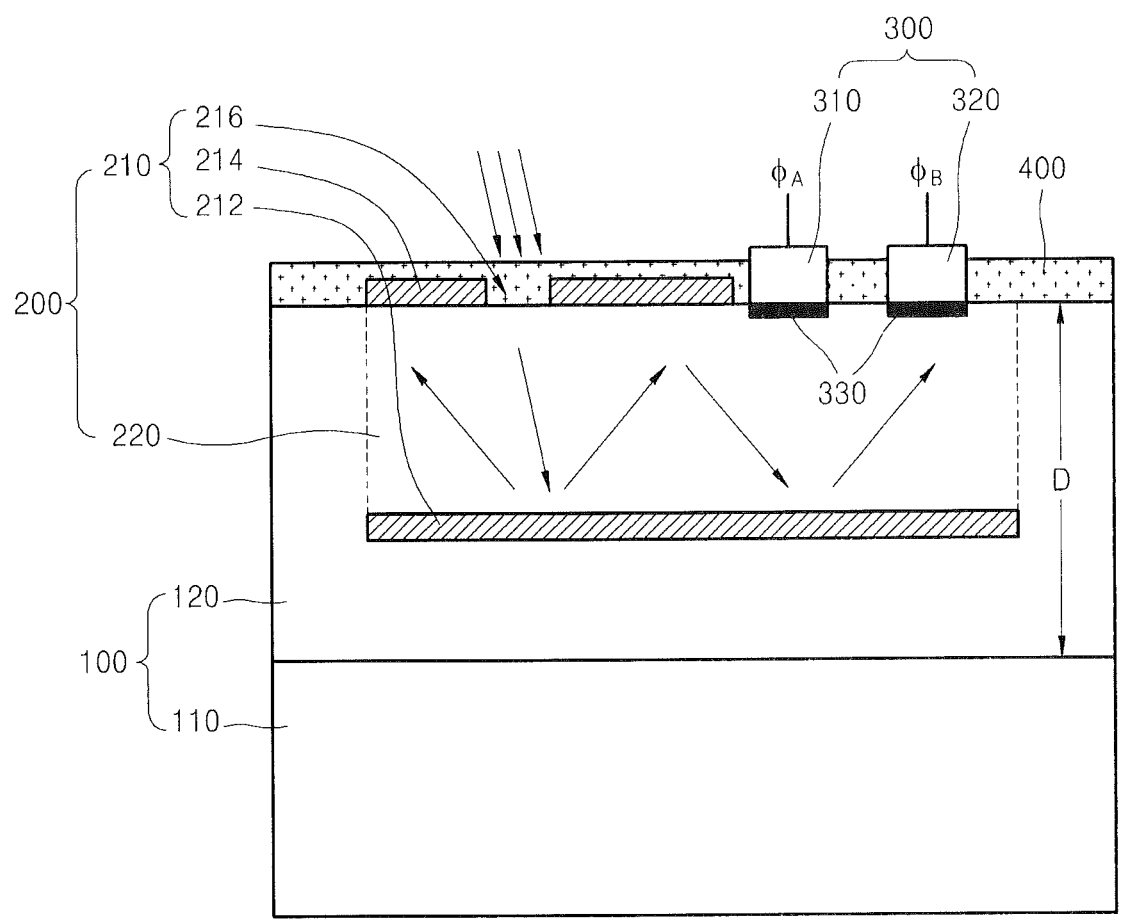
FIG. 1 is a cross-sectional view of a three-dimensional (3D) complementary metal-oxide-semiconductor (CMOS) image sensor (CIS) according to an embodiment of the inventive concept.

The inventive concept will now be described more fully with reference to the accompanying drawings, in which exemplary embodiments of the invention are shown. It will be understood that when an element is referred to as being "on" another element, it can be directly on the other element or intervening elements may also be present. In addition, the thickness or size of each element in the drawings can be exaggerated for convenience of explanation and clarity, and descriptions of elements that are not relevant to the inventive concept are not provided. Like reference numerals in the drawings denote like elements. The terminology used herein is for the purpose of describing particular embodiments only and is not intended to be limiting of exemplary embodiments.

FIG. 1 is a cross-sectional view of a three-dimensional (3D) complementary metal-oxide-semiconductor (CMOS) image sensor (CIS) according to an embodiment of the inventive concept. Referring to FIG. 1, the 3D CIS includes a substrate 110, an epitaxial film 120, an infrared ray (IR) receiving part 200, and an electrode part 300. The substrate 110 and the epitaxial film 120 constitute an epi-wafer, or an epitaxial wafer 100. The epitaxial wafer 100 is a wafer constructed by growing crystalline materials on a single crystalline silicon substrate. In the present embodiment, the epitaxial wafer 100 is used, but the present invention is not limited thereto. For example, the epitaxial wafer 100 may be a polished wafer, an annealed wafer, silicon-on-insulator (SOI) wafer, or the like. In the epitaxial wafer 100 used in the present embodiment, the epitaxial film 120 is previously formed on the substrate 110, and thus the epitaxial film 120 need not be grown on the substrate 110. On the other hand, in the polished wafer and the SOI wafer, the epitaxial film 120 may be grown on the substrate 110. The epitaxial film 120 may be formed to be very thin (e.g., a thickness D of 7 μm or less). Since the epitaxial film 120 is formed to have a thickness within the range described above, the 3D CIS need not be manufactured using a conventional CIS manufacturing process, for example, an epi-process. In particular, since infrared-rays have a long wavelength and are highly transmitted, a conventional infrared-ray receiving part includes an epitaxial film that is formed to be considerably thick, for example, a thickness of 10 μm or greater, in order to sufficiently absorb the IRs. Accordingly, the conventional CIS standard manufacturing process may not be used, and a 3D CIS including an IR receiving part needs to be manufactured using a new manufacturing process, thereby decreasing mass-production of the 3D CIS. In addition, when the thick epitaxial film is used, defect problems such as dangling bonding occur at an interface between the substrate 110 and the epitaxial film 120, thereby deteriorating electrical characteristics of the 3D CIS.

However, in the 3D CIS according to the present embodiment, the epitaxial film 120 is formed to have a thickness of 3 to 4 μm, which is a standard thickness of the epitaxial film required in a conventional CIS manufacturing process. Thus, the 3D CIS according to the present embodiment may be manufactured using a conventional CIS manufacturing process. The epitaxial film 120 may be formed to be thin based on a structure of the IR receiving part 200 formed in the epitaxial film 120, which will be described later.

The IR receiving part 200 includes an IR reflecting film 210 and a photo diode (PD) depletion region 220. The PD depletion region 220 absorbs IR incident thereto to produce electron-hole pairs. The PD depletion region 220 may be a NPD depletion region or a PPD depletion region according to the type of carriers used as a signal. The IR reflecting film 210 includes a lower reflecting film 212 formed on a bottom surface of the PD depletion region 220 and an upper reflecting film 214 formed on a top surface of the PD depletion region 220. An IR incidence portion 216 on which IRs are incident may be formed in the upper reflecting film 214. The IRs incident to the PD depletion region 220 are repeatedly reflected in a zigzag pattern therein by the IR reflecting film 210 in a direction of arrows illustrated in FIG. 1, whereby most of the IRs are absorbed in the PD depletion region 220 to contribute to the production of the electron-hole pairs.

The IR reflecting film 210 is illustrated in the drawings in the form of a flat film, but the present invention is not limited thereto. For example, in order that the incident IRs are repeatedly reflected effectively, the position of the lower reflecting film 212 and the upper reflecting film 214 may be adjusted. In addition, in order that IRs, which are vertically incident into the PD depletion region 220, are repeatedly reflected, the lower reflecting film 212 corresponding to the IR incidence portion 216 may have a curved surface.

The IR reflecting film 210 may be formed of a material that may increase a reflection coefficient of the incident IRs. In general, reflection always occurs at the interface between media having different refractive indices, and the reflection coefficient is larger when a difference between refractive indices of two media is larger. In other words, when light is incident in a straight line, the reflection coefficient may be represented by Equation 1 below where $n_1$ and $n_2$ designate the refractive indices of the two media:

$$\text{Reflection coefficient}(R) = [(n_1 - n_2)/(n_1 + n2)]^2. \tag{1}$$

Thus, the materials of the IR reflecting film 210 may be appropriately selected in consideration of the material of the PD depletion region 220. For example, when the PD depletion region 220 is formed of silicon (Si), the IR reflecting film 210 may be formed as at least one film selected from the group consisting of a highly concentrated P-type ($P^{++}$) silicon film, a germanium (Ge) film, a silicon-germanium (SiGe) film, an oxide (Ox) film, and a silicon nitride (SiN) film. In this regard, the highly concentrated P-type (P++) silicon film may be a silicon film doped with a high concentration of boron (B). Alternatively, to increase the efficiency of the production of the electron-hole pairs, the PD depletion region 220 may be formed of a material having a smaller energy band gap than that of silicon. For example, the PD depletion region 220 may be formed of Ge. In this case, the IR reflecting film 210 may be formed as at least one film selected from the group consisting of a highly concentrated P-type ($P^{++}$) silicon film, a SiGe film, an Ox film, and a SiN film.

The electrode part 300 includes two electrodes; a first electrode 310 and a second electrode 320, and a clock pulse voltage is applied to the first and second electrodes 310 and 320. The frequency of the applied clock pulse is consistent with the frequency of the incident IRs, and the first and second electrodes 310 and 320 alternately collect carriers, for example, electrons, by reflecting a phase difference between the incident IRs and IRs emitted at every clock. By collecting carriers using the method described above, signal information for 3D images may be produced. To facilitate the collection of the carriers, a high concentration doped film 330, for example, an N-type high concentration ($N^+$) doped film, may be formed on a bottom surface of each of the first and second electrodes 310 and 320.

A transparent insulating film 400 may be formed on an upper portion of the epitaxial film 120. However, in some cases, the transparent insulating film 400 may not be formed. The transparent insulating film 400 may be formed to insulate an electrode to which a voltage is applied and the PD depletion region 220 when a voltage for expanding the PD depletion region 220 is applied to the IR receiving part 200.

Figure 2:
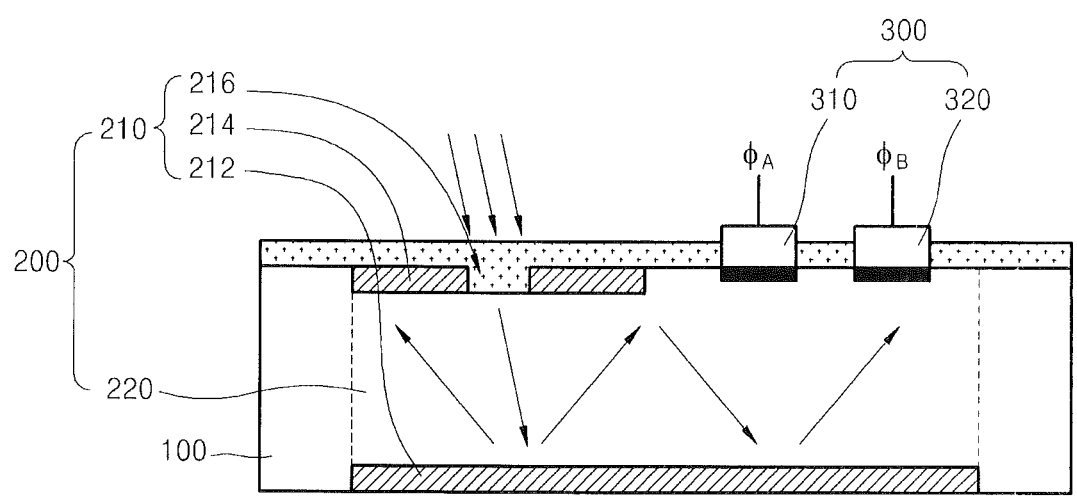
FIG. 2 is a cross-sectional view of a 3D CIS according to another embodiment of the inventive concept.

FIG. 2 is a cross-sectional view of a 3D CIS according to another embodiment of the inventive concept. Referring to FIG. 2, unlike the 3D CIS illustrated in FIG. 1, the 3D CIS according to the present embodiment does not include a lower portion of the epitaxial film 120 or the substrate 110 disposed below the IR receiving part 200. Back illuminated sensors (BISs) have such structure, and the structure includes the lower reflecting film 212 of the IR receiving part 200 formed on a top portion of the epitaxial wafer 100 and the upper reflecting film 214 and the IR incidence portion 216 formed on a bottom portion of the epitaxial wafer 100.

The structure of the back-type 3D CIS may easily be understood in a detailed description with reference to FIGS. 8A through 8C, which will be described later. A detailed description of the elements of the 3D CIS of FIG. 2 corresponding to the elements of the 3D CIS of FIG. 1 is the same as that with reference to FIG. 1, and thus not repeated herein.

Figure 3A:
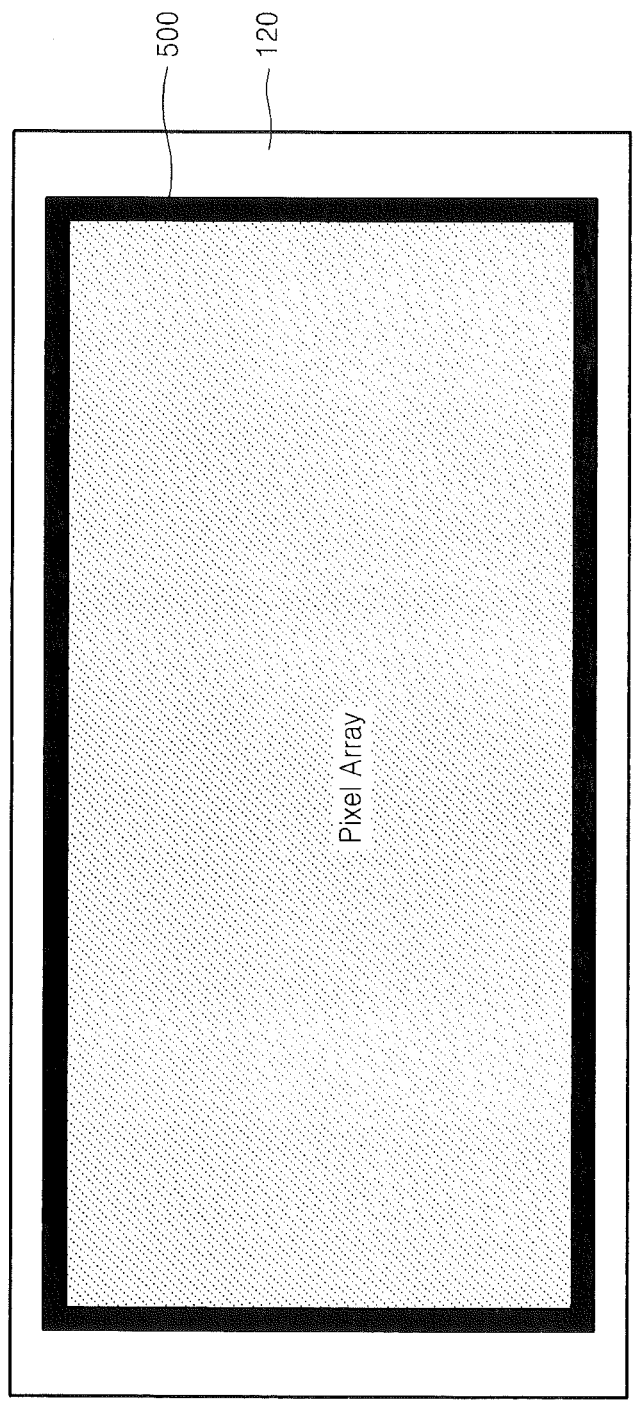
FIGS. 3A through 3C are plan views illustrating structures of a guard ring formed in the 3D CIS of FIG. 1 or FIG. 2, according to embodiments of the inventive concept.
Figure 3B:
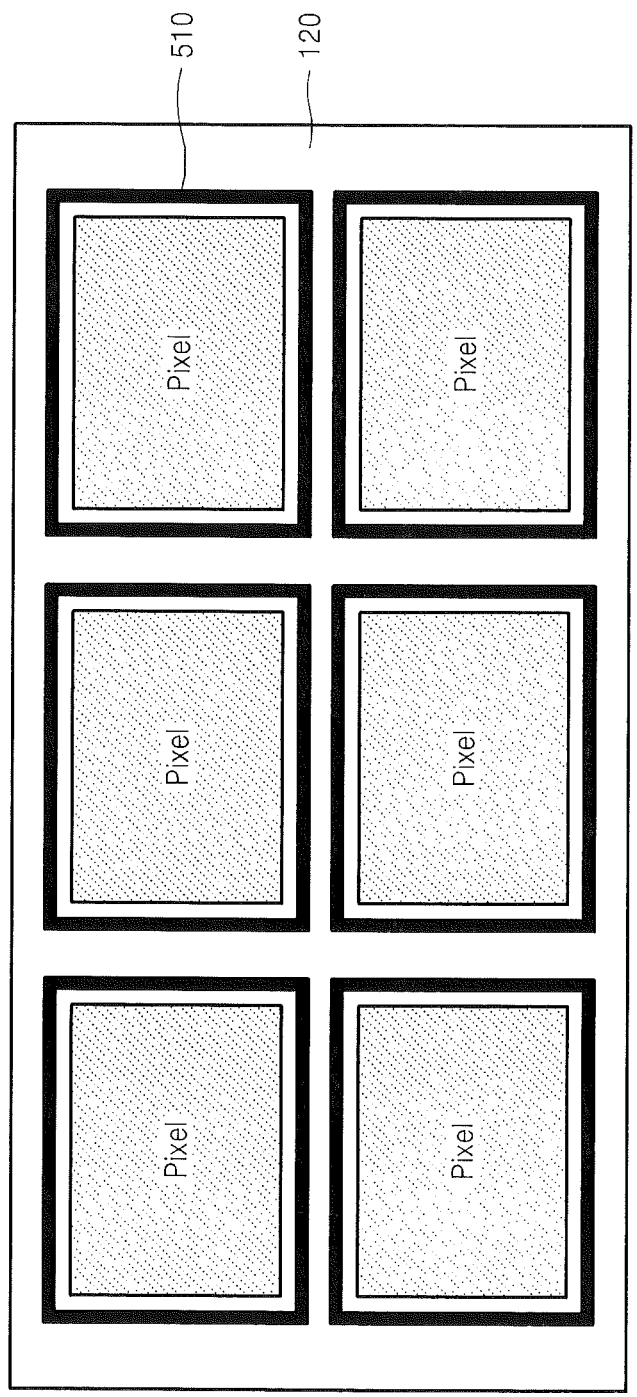
Figure 3C:
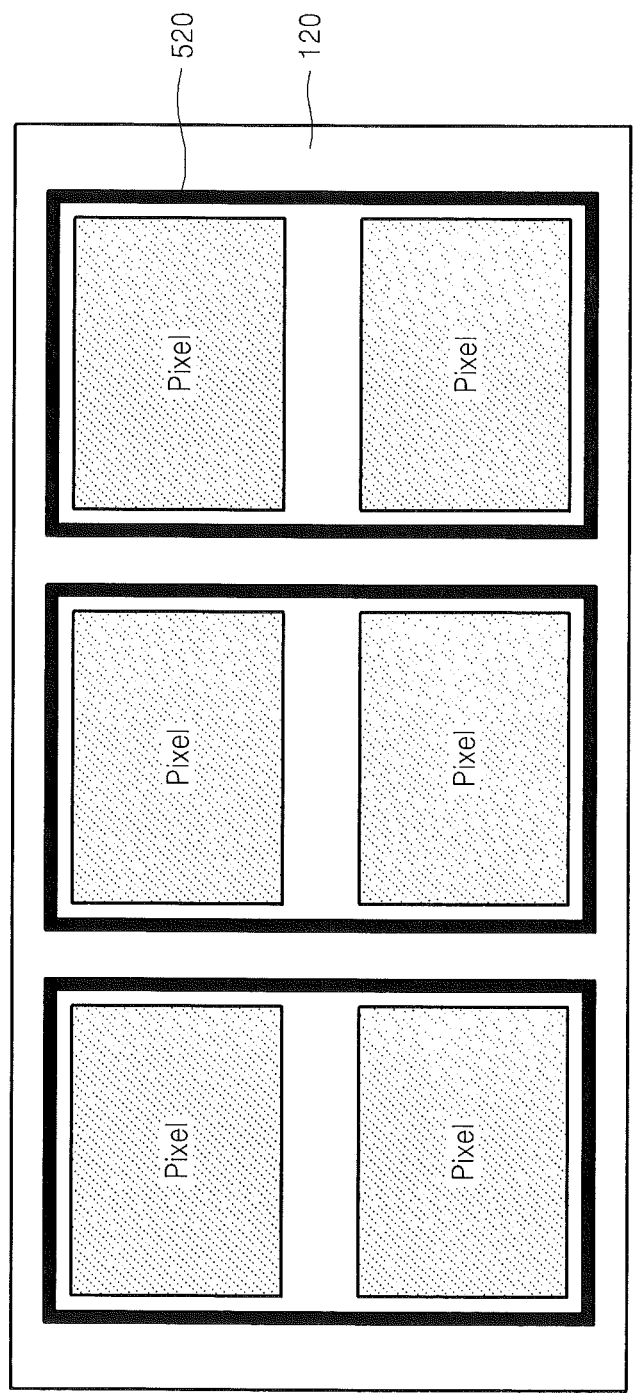

FIGS. 3A through 3C are plan views respectively illustrating structures of guard rings 500, 510 and 520 formed in the 3D CIS of FIG. 1 or FIG. 2, according to embodiments of the inventive concept. When IRs are incident into the PD depletion region 220 to produce electron-hole pairs, the first and second electrodes 310 and 320 collect carriers such as electrons, and holes may be released via a substrate connected to ground. However, some holes may remain in the PD depletion region 220. The holes remaining in the PD depletion region 220 combine with electrons which are subsequently produced to interfere with a satisfactory collection of electrons, thereby deteriorating the characteristics of the 3D CIS. Thus, the holes remaining in the PD depletion region 220 need to be effectively collected. FIGS. 3A through 3C respectively show the structures of the guard rings 500, 510 and 520 for recollecting the remaining holes.

Figure 4:
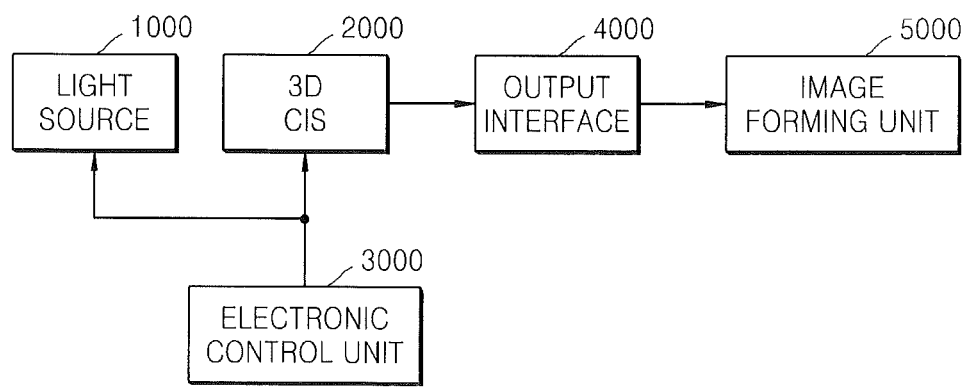
FIG. 4 is a block structural diagram of a sensor system including a 3D CIS, according to an embodiment of the inventive concept.
Figure 5:
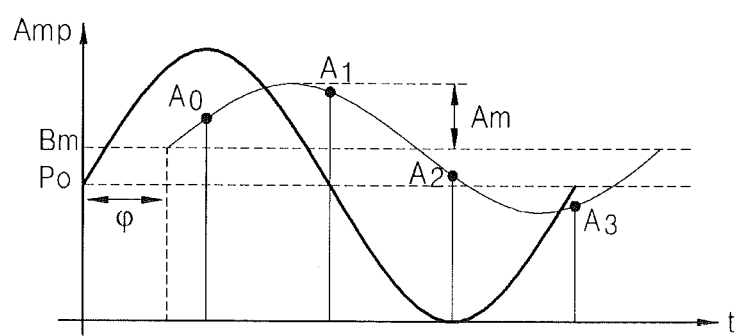
FIG. 5 is a graph for explaining a principle of an infrared-ray sensor used in a 3D CIS, according to an embodiment of the inventive concept.

Referring to FIG. 3A, the guard ring 500 may be formed to surround a pixel array of the 3D CIS. The pixel array is formed in the epitaxial film 120, and thus the guard ring 500 is disposed in the epitaxial film 120. In this case, the PC depletion region 220 and the guard ring 500 share the epitaxial film 120 to be electrically connected to each other. Accordingly, a ground voltage or a certain static bias voltage is applied to the guard ring 500, thereby effectively recollecting the holes remaining in the PD depletion region 220. The guard ring 500 may be formed as a highly concentrated P-type ($P^+$) silicon film, but the present invention is not limited thereto. Referring to FIG. 3B, unlike the guard ring 500 of FIG. 3A, guard rings 510 are formed to surround each of a plurality of unit pixels. When the guard rings 510 are formed in this manner, a distance between holes produced in each unit pixel and each of the guard rings 510 is close, and thus the holes may be more efficiently collected. Referring to FIG. 3C, guard rings 520 are formed to surround pixel pairs. The guard rings 520 may also be formed in such a way that a plurality of unit pixels in the pixel array are grouped in a predetermined number, and the guard rings 520 respectively surround the groups. FIG. 4 is a block structural diagram of a sensor system including a 3D CIS 2000, according to an embodiment of the inventive concept. Referring to FIG. 4, the sensor system includes a light source 1000, the 3D CIS 2000, an electronic control unit 3000, an output interface 4000, and an image forming unit 5000. The light source 1000 emits IRs having a frequency suitable for detecting a subject. The 3D CIS 2000 may have the structure of the 3D CIS of FIG. 1 or FIG. 2, and collects electrons produced by incident IRs to generate an electrical signal. The electronic control unit 3000 modulates the frequency or amplitude of the IRs emitted by the light source 1000, and performs synchronous demodulation with respect to the signal generated by the 3D CIS 2000. The signal generated by the 3D CIS 2000 is transmitted to the image forming unit 5000 via the output interface 4000, and the image forming unit 5000 performs appropriate signal processing to form a 3D color image. The sensor system may further include an optical lens for focusing IRs incident on a front surface of the 3D CIS or removing noise. FIG. 5 is a graph for explaining a principle of an infrared-ray sensor used in a 3D CIS, according to an embodiment of the inventive concept. In the graph, the x-axis denotes time, and the y-axis denotes amplitude. Referring to FIG. 5, a waveform of IRs emitted from a light source is indicated by a thick solid line, and a waveform of IRs that is reflected by a subject to be incident on the 3D CIS is indicated by a thin solid line. The wave profile of the IRs emitted from the light source may be represented by Equation 2 below:

$$P(t)=P_0+P_0 \sin(2\pi+f_{mod}*t). \quad (2)$$

where $f_{mod}$ denotes the modulation frequency of the IR.

The wave profile of the IRs that are incident to the 3D CIS may be represented by Equation 3 below:

$$N(t)=B_m+A_m \sin(2\pi+f_{mod}*t+\phi). \quad (3)$$

In addition, assuming that L denotes a distance between a light source and a subject, the distance and phase difference therebetween satisfies the condition represented by Equation 4 below:

$$L=c\tau/2=c\phi/(4\pi*f_{mod}). \quad (4)$$

In the graph, $A_0$ through $A_3$ denote sampling points. Based on the sampling points $A_0$ through $A_3$, a phase difference ($\phi$) between the infrared ray emitted from the light source and the infrared ray incident to the 3D CIS may be represented by Equation 5 below:

$$\phi=\arctan [(A_0-A_2)/(A1 \sim A_3)]. \quad (5)$$

The phase difference ($\phi$) provides the information of the distance L through Equations 4 and 5. The electrode part 300 of the 3D CIS collects electrons by reflecting the phase difference between the incident IRs and IRs emitted at every clock, thereby generating signals for 3D images.

Figure 6A:
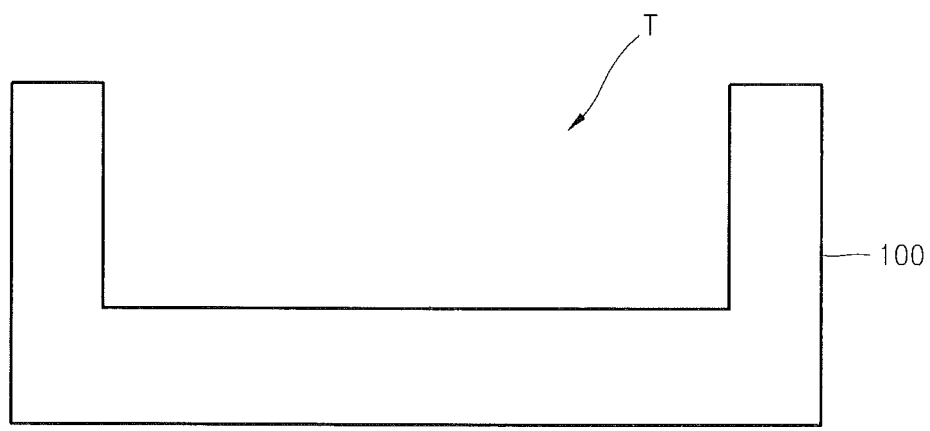
FIGS. 6A through 6E are cross-sectional views sequentially illustrating a method of manufacturing a 3D CIS, according to an embodiment of the inventive concept.

FIG. 6A through 6E are cross-sectional views sequentially illustrating a method of manufacturing a 3D CIS, according to an embodiment of the inventive concept. Referring to FIG. 6A, first, a trench T is formed to be shallow in an epitaxial wafer 100, for example, a thickness of about 3 to about 4 μm in the same manner as in a shallow trench isolation (STI) process. As described above, the epitaxial wafer 100 is a wafer in which the epitaxial film is grown on the silicon substrate. Thus, the depth of the trench T may be little smaller or almost the same as the thickness of the epitaxial film.

Figure 6B:
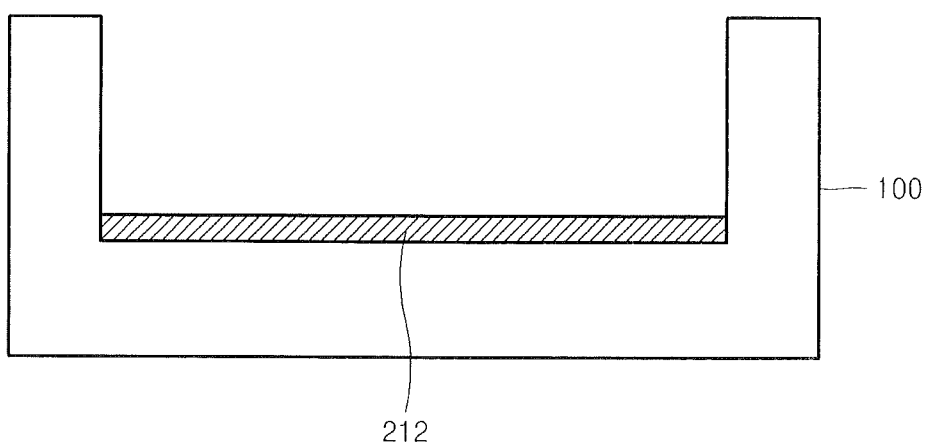

Referring to FIG. 6B, the lower reflecting film 212 is formed on a bottom surface of the trench T by selective chemical vapour deposition (CVD). The formation of the lower reflecting film 212 may also be performed by other methods. The lower reflecting film 212 may be formed of a material having a different refractive index from that of the material of the upper portion of the reflecting film 212. For example, when a silicon film on the upper portion of the reflecting film 212 is formed, the lower reflecting film 212 may be formed as at least one film selected from the group consisting of a highly concentrated P-type (P$^{++}$) silicon film, a Ge film, a SiGe film, an Ox film, and a SiN film. In the present embodiment, the lower reflecting film 212 may be formed as a silicon film doped with a high concentration of boron.

To increase the efficiency of the production of the electron-hole pairs, a layer on the upper portion of the reflecting film 212 may be formed of a material having a smaller energy band gap than that of silicon. For example, the layer on the upper portion of the reflecting film 212 may be formed of Ge. In this case, the lower reflecting film 212 may be formed as at least one film selected from the group consisting of a highly concentrated P-type (P$^{++}$) silicon film, a SiGe film, an Ox film, and a SiN film.

The lower reflecting film 212 may be formed in the form of a flat film as described above, and may also be formed to have a curved surface to repeatedly reflect effectively the incident IRs. In particular, a portion of the lower reflecting film 212, corresponding to the IR incidence portion 216 formed above the lower reflecting film 212 may be curved at a predetermined angle with respect to a horizontal plane so as to reflect IRs vertically incident thereto.

Figure 6C:
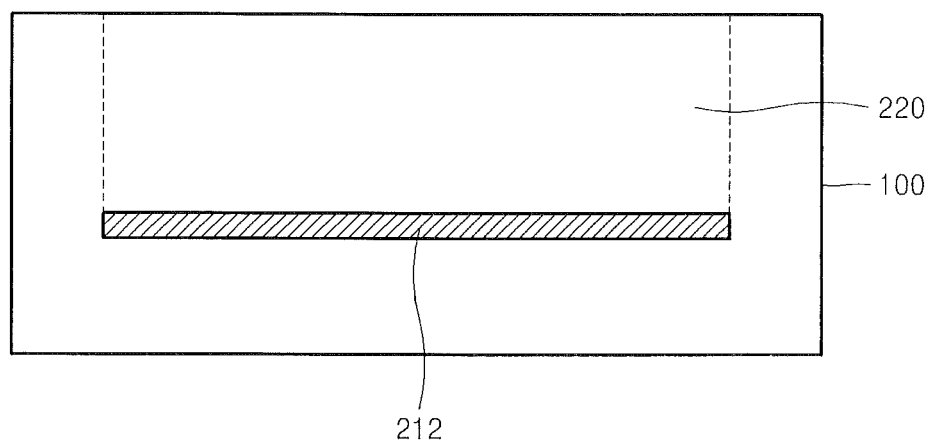

Referring to FIG. 6C, silicon is selectively grown on the lower reflecting film 212 to form the epitaxial film 220. In some cases, the epitaxial film 220 may be annealed for lateral single crystal growth. The heat treatment process for lateral single crystal growth may be performed at a temperature in the range of 600 to 900° C. for several seconds to several hours. The epitaxial film 220 acts as a PD depletion region.

Figure 6D:
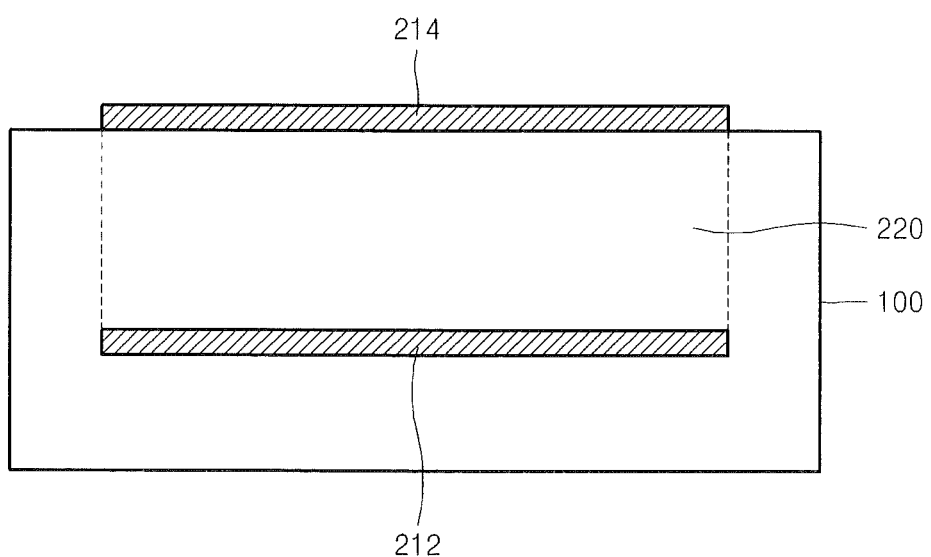

Referring to FIG. 6D, the upper reflecting film 214 is formed on the epitaxial film 220. The formation and material of the upper reflecting film 214 have already been described in conjugation with the lower reflecting film 212. The upper reflecting film 214 needs not to be formed to have a curved surface, unlike the lower reflecting film 212. In the present embodiment, a top surface of the epitaxial film 220 and a top surface of the epitaxial wafer 100 are at the same height. However, the top surface of the epitaxial film 220 may be at a lower height than the top surface of the epitaxial wafer 100. For example, the epitaxial film 220 may be partially formed in the trench T, and the upper reflecting film 214 may be formed to fill the remaining portion of the trench T.

Figure 6E:
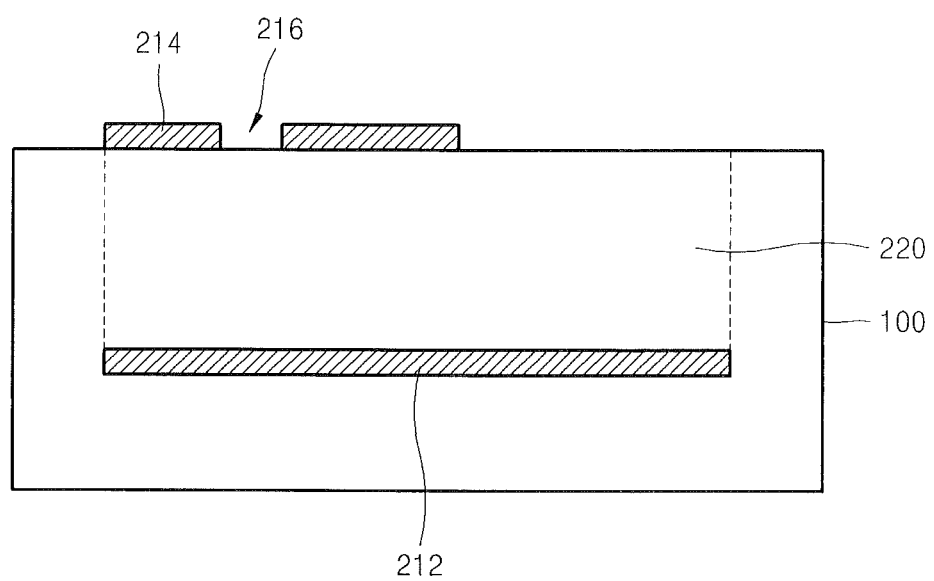

Referring to FIG. 6E, the upper reflecting film 214 is patterned in a certain shape to form the IR incidence portion 216 in a portion of the upper reflecting film 214. Subsequently, the transparent insulating film 400 and the electrode part 300 are respectively formed, thereby completing the manufacturing of the 3D CIS as illustrated in FIG. 1. A guard ring having one of the structures of the guard rings illustrated in FIGS. 3A through 3C may be further formed.

Figure 7A:
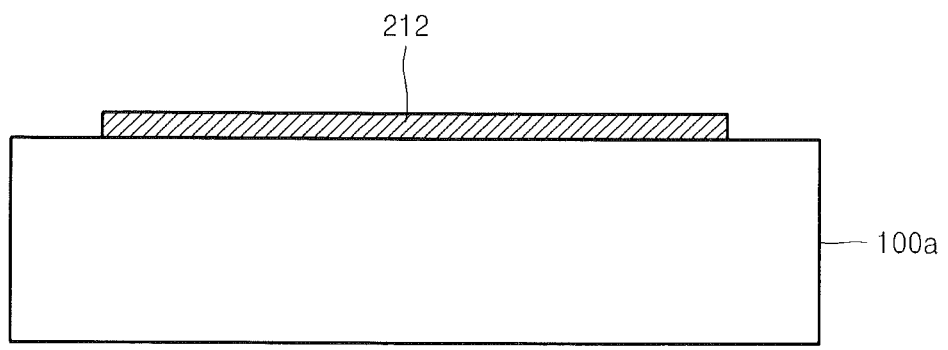
FIGS. 7A through 7C are cross-sectional views sequentially illustrating a method of manufacturing a 3D CIS, according to another embodiment of the inventive concept.
Figure 7B:
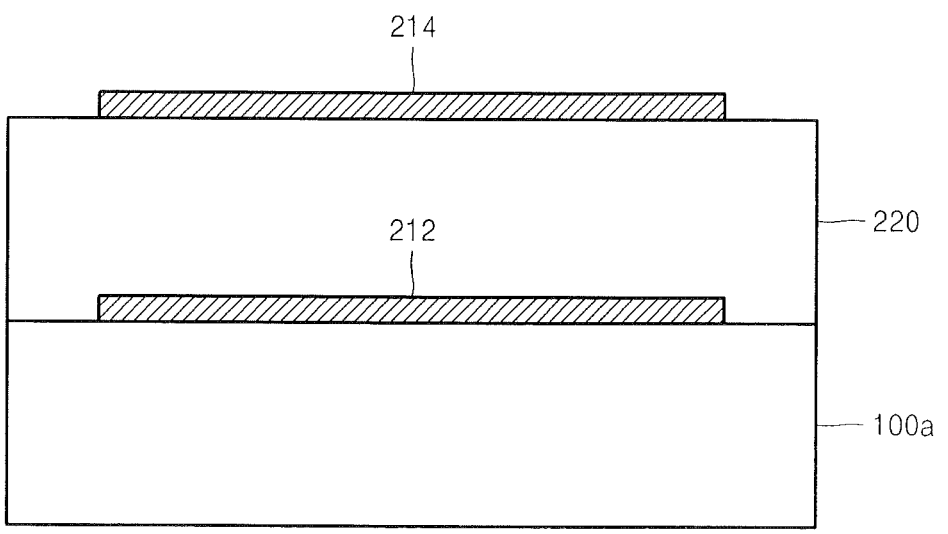
Figure 7C:
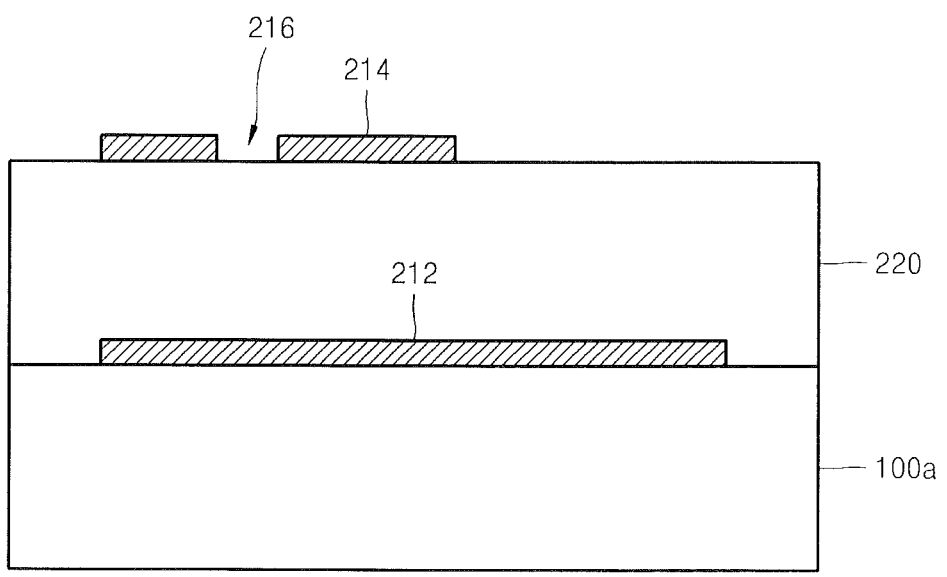

FIGS. 7A through 7C are cross-sectional views sequentially illustrating a method of manufacturing a 3D CIS, according to another embodiment of the inventive concept. Hereinafter, only features different from the features of the manufacturing method of FIGS. 6A through 6E will be described. Referring to FIG. 7A, first, the lower reflecting film 212 is formed on a wafer 100a. The wafer 100a may be one selected from the group consisting of a polished wafer, an annealed wafer, and a SOI wafer, unlike the epitaxial wafer 100 illustrated in FIGS. 6A through 6E. Referring to FIG. 7B, silicon is grown on the wafer 100a and the lower reflecting film 212 to form the epitaxial film 220. The epitaxial film 220 may be formed to have a thickness of 7 μm or less. After the epitaxial film 220 is formed, the upper reflecting film 214 is formed on the epitaxial film 220.

Referring to FIG. 7C, the upper reflecting film 214 is patterned to form the IR incidence portion 216. In the present embodiment, the IR receiving part may be formed to be thin even by using other wafers, instead of the epitaxial wafer, and the technical goal of the inventive concept may still be achieved. Thus, the method of manufacturing a 3D CIS in the present embodiment may be performed using a conventional CIS manufacturing process.

Figure 8A:
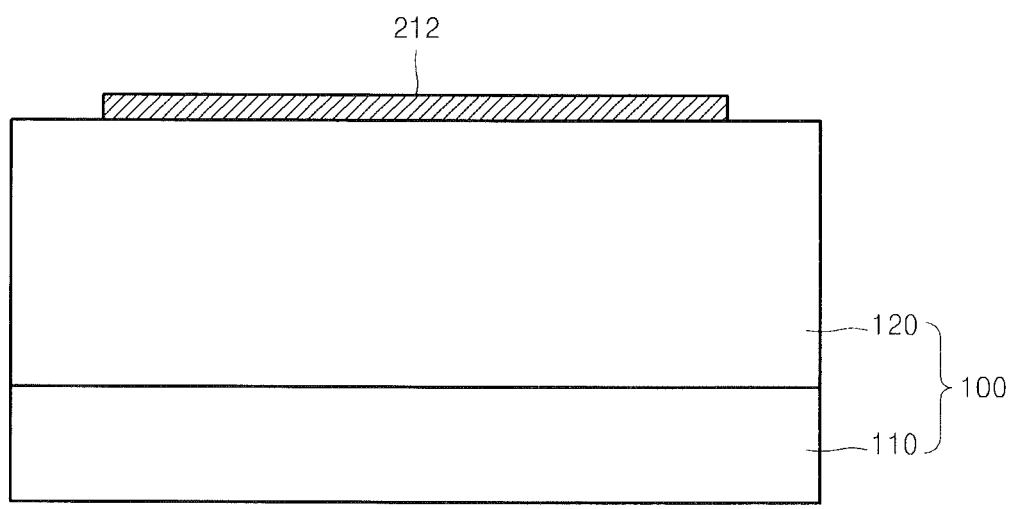
FIGS. 8A through 8C are cross-sectional views sequentially illustrating a method of manufacturing a 3D CIS, according to another embodiment of the inventive concept.
Figure 8B:
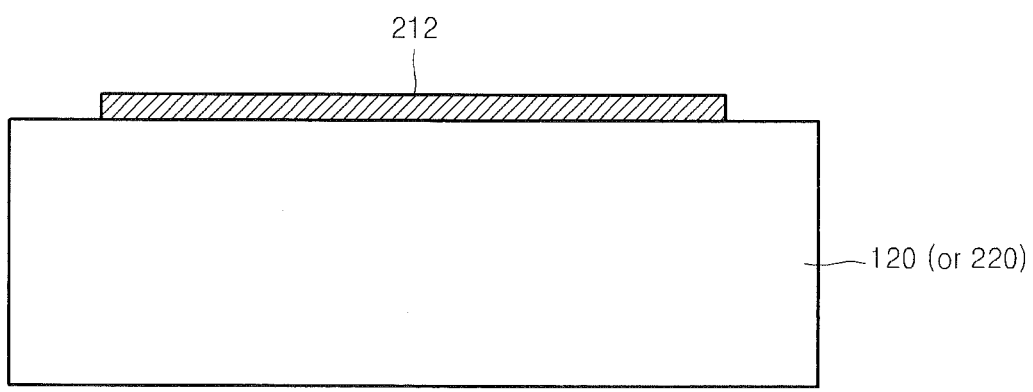
Figure 8C:
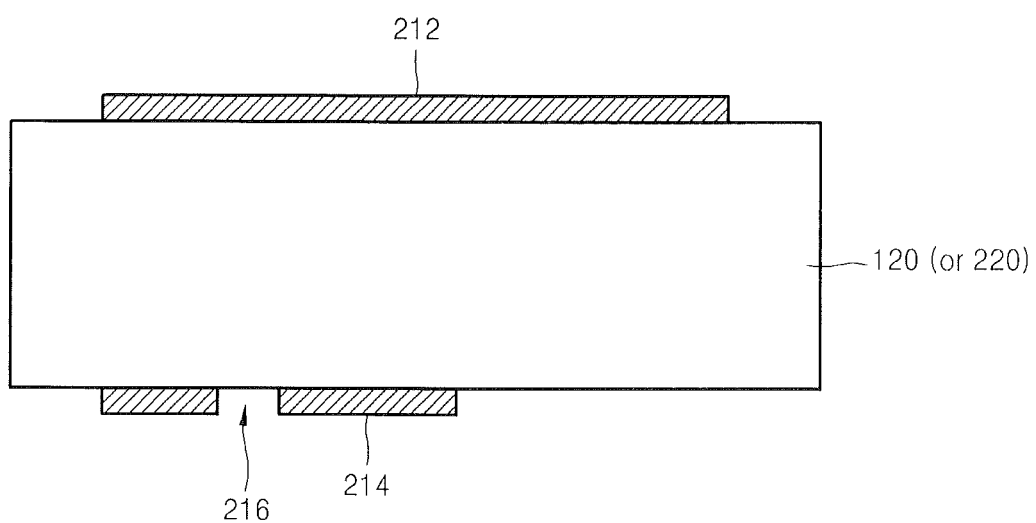

FIGS. 8A through 8C are cross-sectional views sequentially illustrating a method of manufacturing a 3D CIS, according to another embodiment of the inventive concept. Referring to FIG. 8A, the lower reflecting film 212 is formed on the epitaxial wafer 100. As described above, the epitaxial wafer 100 may include the substrate 110 and the epitaxial film 120, and the lower reflecting film 212 is formed on the epitaxial film 120. Referring to FIG. 8B, a lower portion of the epitaxial wafer 100 is removed by back grinding to expose a lower surface of the epitaxial film 120. Referring to FIG. 8C, the upper reflecting film 214 is formed on the exposed lower surface of the epitaxial film 120, and is then patterned to form the IR incidence portion 216.

The 3D CIS manufactured according to the present embodiment has a back-side structure in which IRs are incident onto the lower surface of the epitaxial film 120, i.e., a BIS structure. The transparent insulating film 400 and the electrode part 300 are formed on the lower surface of the epitaxial film 120. When such a structure is disposed upside down, it has the same structure as that of the 3D CIS illustrated in FIG. 2.

While the inventive concept has been particularly shown and described with reference to exemplary embodiments thereof, it will be understood that various changes in form and details may be made therein without departing from the spirit and scope of the following claims.

What is claimed is:

1. A CMOS image sensor, comprising:
a substrate having a light receiving surface thereon and a first light reflecting film extending within said substrate, said first light reflecting film configured to redirect light incident thereon towards the light receiving surface;
a second light reflecting film on the light receiving surface, said second light reflecting film configured to redirect reflected light received from said first light reflecting film towards said first light reflecting film; and
a first electrode electrically coupled to said substrate, said first electrode configured to collect charge carriers generated in response to a reflection of light between said first and second light reflecting films.

2. The CMOS image sensor of claim 1, wherein said first electrode is responsive to a first periodic signal.

3. The CMOS image sensor of claim 2, further comprising a second electrode electrically coupled to said substrate, said second electrode configured to collect charge carriers generated in response to the reflection of light between said first and second light reflecting films; and wherein said second electrode is responsive to a second periodic signal.

4. The CMOS image sensor of claim 3, wherein the first and second periodic signals are clock signals having different phases relative to each other.

5. The CMOS image sensor of claim 1, wherein said first light reflecting film comprises a material selected from a group consisting of p-type silicon, germanium, silicon germanium, oxide and silicon nitride.

6. The CMOS image sensor of claim 1, wherein a distance between the first and second light reflecting films is in a range between about 3 um and 4 um.

7. The CMOS image sensor of claim 1, further comprising a semiconductor guard ring in said substrate, surrounding the first light reflecting film.

8. A three-dimensional (3D) complementary metal-oxide-semiconductor (CMOS) image sensor comprising: an infrared ray (IR) receiving part for absorbing infrared rays (IRs) incident thereto by repetitive reflection to produce electron-hole pairs (EHPs); and an electrode part formed on the IR receiving part and collecting electrons produced by applying a predetermined voltage thereto;
wherein the IR receiving part comprises: a photo diode (PD) depletion region absorbing the IRs to produce the EHP; and an IR reflecting film, wherein the IR reflecting film comprises a lower reflecting film formed on a bottom surface of the PD depletion region and an upper reflection film formed on a top surface of the PD depletion region, wherein the upper reflection film comprises an IR incident portion onto which the IR is incident.

9. The 3D CMOS image sensor of claim 8, wherein the IR receiving part is formed to have a thickness of 7 um or less.

10. The 3D CMOS image sensor of claim 8, wherein the lower reflecting film and the upper reflecting film have a structure allowing the IRs incident into the PD depletion region to be repeatedly reflected in the PD depletion region.

11. The 3D CMOS image sensor of claim 8, wherein the PD depletion region comprises any one of silicon and a material having a smaller energy band gap than silicon, and the IR reflecting film comprises a material having a different refractive index from the material of the PD depletion region.

12. The 3D CMOS image sensor of claim 11, wherein, when the PD depletion region comprises silicon, the IR reflecting film is formed as at least one film selected from the group consisting of a highly concentrated P-type ($P^{++}$) silicon (Si) film, a germanium (Ge) film, a silicon-germanium (SiGe) film, an oxide (Ox) film, and a silicon nitride (SiN) film.

13. The 3D CMOS image sensor of claim 8, further comprising a guard ring for releasing the produced holes, the guard ring to which a ground or predetermined bias voltage is applied.

14. The 3D CMOS image sensor of claim 13, wherein the guard ring is formed as a highly concentrated P-type (r) silicon (Si) film, and is formed to have any one structure of a structure in which the guard ring surrounds a pixel array of the 3D CMOS image sensor, a structure in which a plurality of the guard rings respectively surround pixels in the pixel array, and a structure in which pixels in the pixel array are divided into a plurality of pixel groups and a plurality of the guard rings respectively surround the plurality of pixel groups.

15. The 3D CMOS image sensor of claim 8, wherein the electrode part comprises two electrodes, the two electrodes to which a clock pulse corresponding to the frequency of the IRs is applied.

16. The 3D CMOS image sensor of claim 8, further comprising a substrate and an epitaxial film formed on the substrate, having a front-side structure in which an IR incident portion of the IR receiving part is formed in a front side direction of the substrate, or having a back-side structure in which the IR incidence portion of the IR receiving part is formed in a back side direction of the substrate.

17. The 3D CMOS image sensor of claim 16, wherein the substrate is any one of an epitaxial wafer, a polished wafer, an annealed wafer, and a silicon-on-insulator (SOI) wafer.

18. A sensor system comprising:
a light source for emitting infrared rays (IRs);
a CMOS image sensor for receiving the IRs reflected by a target object, said CMOS image sensor comprising:
a substrate having a light receiving surface thereon and a first light reflecting film extending within said substrate, said first light reflecting film configured to redirect light incident thereon towards the light receiving surface;
a second light reflecting film on the light receiving surface, said second light reflecting film configured to redirect reflected light received from said first light reflecting film towards said first light reflecting film; and
a first electrode electrically coupled to said substrate, said first electrode configured to collect charge carriers generated in response to a reflection of light between said first and second light reflecting films;
an electronic control unit for modulating the IRs emitted from the light source and performing synchronous demodulation of a signal generated by the CMOS image sensor; and
an image forming unit for receiving the signal from the 3D-CMOS image sensor through an output interface to form a 3D image.

\* \* \* \* \*